(12) United States Patent
Specht et al.

(10) Patent No.: US 10,193,340 B2
(45) Date of Patent: Jan. 29, 2019

(54) MULTI-LEVEL CASCADED H-BRIDGE STATCOM CIRCULATING COOLING FLUID WITHIN ENCLOSURE

(71) Applicant: American Superconductor Corporation, Ayer, MA (US)

(72) Inventors: Andrew Specht, Franklin, WI (US); John R. Brubaker, Milwaukee, WI (US); Mark D. Putnam, Oregon, WI (US); Douglas C. Folts, Baraboo, WI (US); David G. Oteman, Delafield, WI (US); Patrick S. Flannery, Madison, WI (US)

(73) Assignee: American Superconductor Corporation, Ayer, MA (US)

( * ) Notice: Subject to any disclaimer, the term of this patent is extended or adjusted under 35 U.S.C. 154(b) by 0 days.

(21) Appl. No.: 15/725,486

(22) Filed: Oct. 5, 2017

(65) Prior Publication Data

US 2018/0269682 A1    Sep. 20, 2018

Related U.S. Application Data

(63) Continuation-in-part of application No. 15/459,187, filed on Mar. 15, 2017, now Pat. No. 10,130,009.

(51) Int. Cl.
*H02M 7/483* (2007.01)
*H02J 3/18* (2006.01)
(Continued)

(52) U.S. Cl.
CPC ............ *H02J 3/1857* (2013.01); *H02B 1/565* (2013.01); *H05K 7/20236* (2013.01);
(Continued)

(58) Field of Classification Search
CPC ............ H05K 7/20245; H05K 7/20263; H05K 7/2097; H05K 7/20927; F28D 2021/0031; F28D 2021/0028; H02M 2007/4835
See application file for complete search history.

(56) References Cited

U.S. PATENT DOCUMENTS

| 4,140,174 A | * | 2/1979 | Lingenfelter ......... F28D 1/0325 165/104.33 |
| 5,642,275 A | | 6/1997 | Peng |

(Continued)

FOREIGN PATENT DOCUMENTS

| CN | 1 738 144 A | 2/2006 |
| EP | 2 416 486 A1 | 2/2012 |

(Continued)

OTHER PUBLICATIONS

ABB PCS100 STATCOM product information, retrieved from the Internet Jul. 18, 2017: http://www.abb.com/product/seitp322/fcfb1267f06615994825770c0013caf3.aspx (2 pages).

(Continued)

*Primary Examiner* — Harry R Behm
(74) *Attorney, Agent, or Firm* — Verrill Dana, LLP; John W. Powell

(57) ABSTRACT

A static synchronous compensator configured to be installed in and provide reactive power to a medium voltage electric distribution system. There is a multi-level cascaded H-bridge (CHB) converter in an enclosure, having a nominal operating voltage in the medium voltage range. There is a first electrical bushing connecting the medium voltage electric distribution system to the input of the CHB converter. There is a second electrical bushing connecting ground or floating ground to the output of the CHB converter. There is a cooling system, which circulates the cooling fluid between in the interior of the enclosure to cool the CHB converter.

(Continued)

There is a controller to control the converter to output reactive power at a medium voltage level.

23 Claims, 13 Drawing Sheets

(51) Int. Cl.
  *H02B 1/56* (2006.01)
  *H05K 7/20* (2006.01)
  *H02B 1/26* (2006.01)

(52) U.S. Cl.
  CPC .......... *H05K 7/20927* (2013.01); *H02B 1/26* (2013.01); *H02M 2007/4835* (2013.01)

(56) References Cited

U.S. PATENT DOCUMENTS

| | | | |
|---|---|---|---|
| 6,005,788 | A | 12/1999 | Lipo |
| 6,016,007 | A | 1/2000 | Sanger |
| RE37,126 | E | 4/2001 | Peng et al. |
| 7,230,837 | B1 | 6/2007 | Huang et al. |
| 8,169,107 | B2 | 5/2012 | Hammond et al. |
| 8,619,446 | B2 | 12/2013 | Liu et al. |
| 8,848,407 | B2 | 9/2014 | Blomberg |
| 8,860,380 | B2 | 10/2014 | Hasler |
| 8,982,593 | B2 | 3/2015 | Nondahl et al. |
| 2001/0032718 | A1 | 10/2001 | Sheerin |
| 2008/0144342 | A1 | 6/2008 | Du |
| 2011/0205768 | A1* | 8/2011 | Svensson ............ H02J 3/1857 363/49 |
| 2012/0063181 | A1 | 3/2012 | Chimento |
| 2013/0107455 | A1* | 5/2013 | Cottet ............... H05K 7/20672 361/694 |
| 2013/0169257 | A1 | 7/2013 | Baek et al. |
| 2014/0097804 | A1* | 4/2014 | Hasler ................ H02J 3/18 320/166 |
| 2015/0003015 | A1 | 1/2015 | Kulkarni |
| 2015/0028831 | A1 | 1/2015 | Glinka |
| 2015/0055298 | A1* | 2/2015 | You ................... F28D 15/00 361/699 |
| 2016/0139578 | A1* | 5/2016 | Hasler ................ H02J 3/1857 700/295 |

FOREIGN PATENT DOCUMENTS

| | | | |
|---|---|---|---|
| EP | 2825008 | A1 | 1/2015 |
| EP | 2988579 | A1 * | 2/2016 ........ H05K 7/20236 |
| WO | 2010/094338 | A1 | 8/2010 |
| WO | 2012/167834 | A1 | 12/2012 |

OTHER PUBLICATIONS

AMSC Dynamic Volt-Amp Reactive (D-VAR) Compensation Solution product material, retrieved from the Internet Jul. 18, 2017: http://www.amsc.com/documents/d-var-data-sheet/\ (2 pages).

GE Static Synchronous Compensator STATCOM product material, retrieved from Internet Jul. 18, 2017: https://www.gegridsolutions.com/PowerD/catalog/statcom.htm (2 pages).

TMT&D Corporation and Mitsubishi STATCOM product material, retrieved from the Internet Jul. 18, 2017: http://www.meppi.com/Products/FACTS/Documents/FACTS%20Technologies%20and%20STATCOM.pdf (8 pages).

S&C Electric Company Pure Wave DSTATCOM Distributed Static Compensator product material, retrieved from the Internet Jul. 18, 2017: http://www.sandc.com/en/products--services/products/purewave-dstatcom-distributed-static-compensator/ (2 pages).

Comsys ADF P700 STATCOM product material, retrieved from the Internet Jul. 18, 2017: https://adfpowertuning.com/products/adf-p700-statcom.html (9 pages).

NR Electric Co., Ltd. PCS-9583 Static Synchronous Compensator (STATCOM) product material, retrieved from the Internet Jul. 18, 2017: http://www.nrec.com/en/product/PCS-9583.html (4 pages).

AMSC D-SVC product material, retrieved from the Internet Jul. 18, 2017: http://www.amsc.com/documents/distributed_static_var_compensator_d-svc_system_/ (2 pages).

Iman-Eini et al. "A Modular Strategy for Control and Voltage Balancing of Cascaded H-Bridge Rectifiers" IEEE Transactions on Power Electronics, Institute of Electrical and Electronics Engineers, 23(5):2428-2442, 2008.

Karamanakos et al. "An Enumeration-Based Model Predictive Control Strategy for the Cascaded H-Bridge Multilevel Rectifier," IEEE Transactions on Industrial Electronics, 61(7):3480-3489, 2014.

Liu et al. "An Optimal Combination Modulation Strategy for a Seven-level Cascade Multilevel Converter Based STATCOM," IEEE Semiconductor Power Electronics Center, North Carolina State University, Raleigh NC; 1(4244-0365):1732-1737, 2006.

Townsend et al. "Optimization of Switching Losses and Capacitor Voltage Ripple Using Model Predictive Control of a Cascaded H-Bridge Multilevel StatCom," IEEE Transactions on Power Electronics, 28(7):3077-3087, 2013.

International Search Report with Written Opinion, dated Jun. 28, 2018, received in international patent application No. PCT/US2018/022541, 12 pages.

International Search Report with Written Opinion, dated Jul. 2, 2018, received in international patent application No. PCT/US2018/022666, 12 pages.

Sato T et al: "Cooling Effect by Gas Density of SF6 Gas Insulated Transformer", IEE Transactions on Power Apparatus and Systems, IEEE Inc. New York, US, vol. 101, No. 2, Jun. 1, 1982, 7 pages.

* cited by examiner

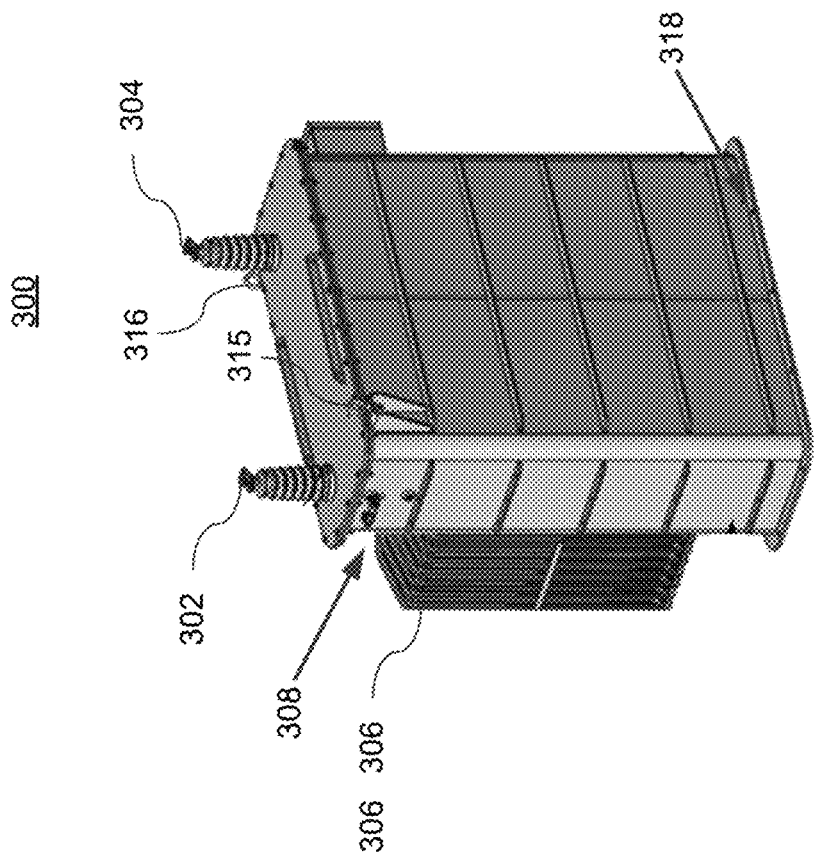
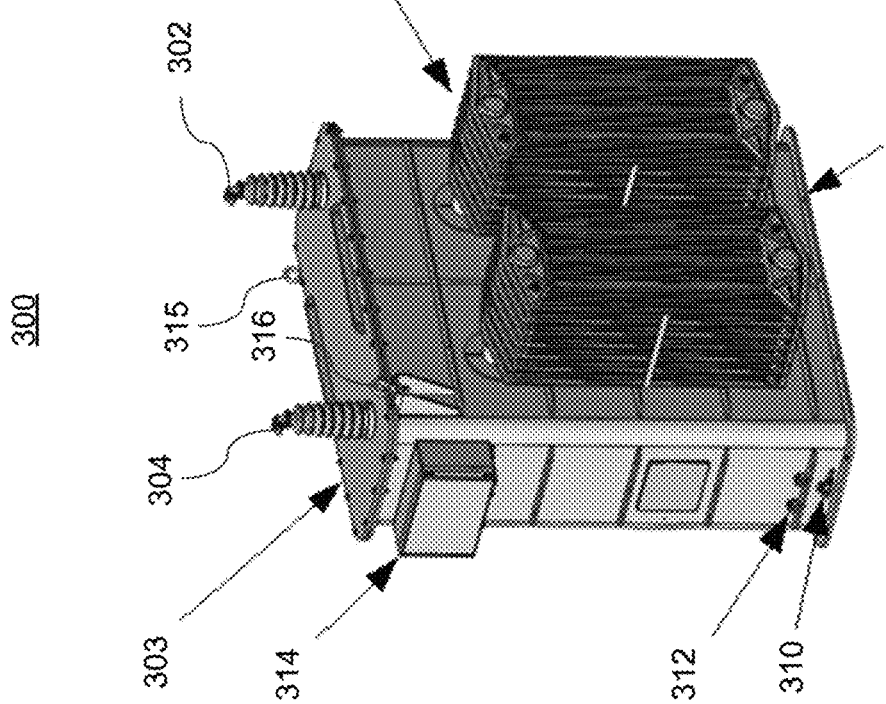
FIG. 9A
FIG. 9B

MULTI-LEVEL CASCADED H-BRIDGE STATCOM CIRCULATING COOLING FLUID WITHIN ENCLOSURE

CROSS REFERENCE TO RELATED APPLICATIONS

This application is a continuation-in-part of U.S. patent application Ser. No. 15/459,187 filed Mar. 15, 2017, which is incorporated herein by reference in its entirety.

FIELD OF INVENTION

The present invention generally relates to a static synchronous compensator (STATCOM) and more specifically to a medium voltage STATCOM which may be connected directly to medium voltage distribution lines in a utility power network.

BACKGROUND

The nature of electrical loads and the mixture of generation sources on medium voltage distribution lines in utility power networks is changing due largely to increased presence of solar generation plants and other distributed generation (DG) equipment. While these new power sources are a very positive development, they can create electrical problems at specific locations on distribution lines, which has increased the need by utilities for targeted dynamic voltage regulation solutions on distribution lines, often far from substations.

Switched capacitor banks and/or tap changing voltage regulators may be installed along medium voltage distribution lines; however, they are often not a sufficient solution to the electrical problems that need to be addressed by utilities caused by DG power sources. Conventional medium voltage STATCOMs may provide a complete solution to the electrical problems faced by utilities; however, given their size, footprint, and collateral connection equipment required, they must be ground-based systems installed within a substation. This prevents their widespread adoption into distribution grids and critically precludes them from use for voltage correction at the optimum points of connection on such grids. Existing medium voltage STATCOMs supplied by companies such as AMSC, General Electric, ABB, S&C Electric, and Mitsubishi, are contained in ground mounted enclosures or installed within a ground mounted building, in both cases within a substation. Many of these STATCOMs use low voltage power electronics, which requires additional dedicated external equipment (e.g. step-up transformers) and associated footprint and connections to realize connection to the medium voltage distribution grid.

Space, footprint, and collateral connection equipment are not particularly challenging for STATCOMs designed for use in transmission systems. In contrast to this, distribution lines are often located in areas that have limited land access (industrial parks, residential neighborhoods or land constrained right-of-ways) or other siting issues that make the construction of a dedicated substation prohibitive from a cost, legal or political standpoint.

SUMMARY

An object of this invention is to provide a compact, medium voltage STATCOM which is configured to be pole mounted so as to facilitate installation on distribution lines for targeted dynamic voltage regulation solutions.

In one aspect, the invention features a static synchronous compensator configured to be installed in and provide reactive power to a medium voltage electric distribution system. There is an enclosure having an interior region and an external surface and a multi-level cascaded H-bridge (CHB) converter, contained in the interior region of the enclosure. The CHB converter has a nominal operating voltage at a medium voltage level, where a medium voltage level is in the range of approximately 1 kV to approximately 35 kV AC. The CHB converter also has an input and an output. There is a first electrical bushing on the external surface of the enclosure having a first end configured to be connected to a first phase of the medium voltage electric distribution system and a second end connected to the input of the multi-level CHB converter. There is a second electrical bushing on the external surface of the enclosure having a first end configured to be connected to one of ground, floating ground, or a second phase, and a second end connected to the output of the multi-level CHB converter. There is a cooling system configured to circulate a cooling fluid in the interior of the enclosure to cool the multi-level CHB converter. There is also a controller configured to control the multi-level CHB converter to output reactive power to the medium voltage electric distribution system at a medium voltage level.

In further aspects of the invention one or more of the following features may be included. There may be further included a mounting member on a second external surface of the enclosure configured to mate with a bracket affixed to the utility pole to mount the static synchronous compensator on the utility pole. The cooling system may be configured to passively circulate the cooling fluid in the interior of the enclosure by way of natural convection cooling. The cooling system may include a heat exchanger, in fluid communication with the interior region of the enclosure, and wherein the cooling system is configured to circulate the cooling fluid between the heat exchanger and the interior of the enclosure by way of natural convection cooling to cool the multi-level CHB converter. The enclosure may include a plurality of vertical cooling channels formed on an interior wall of the enclosure and the cooling system may be configured to circulate the cooling fluid in the interior of the enclosure and through the plurality of cooling channels by way of natural convection cooling to cool the multi-level CHB converter. The multi-level CHB converter comprises a plurality of discrete components positioned in a vertical direction in the interior region of the enclosure such that they have a heat density weighted average center at a first height along the vertical direction in the interior region of the enclosure; wherein the heat exchanger having a vertical cooling average center at a second height along vertical direction in the interior region of the enclosure; and wherein the first height of the heat density weighted average center is below the second height of the vertical cooling average center of the heat exchanger in order to sustain flow of the cooling fluid between the enclosure and the heat exchanger through natural convention. The multi-level CHB converter may comprise a plurality of capacitors, a plurality of inductors, and a plurality of semiconductor switches, and the plurality of capacitors may be positioned at a height along the vertical direction which is greater than the height along the vertical direction of the plurality of inductors, and the plurality of semiconductor switches. The cooling fluid may include dielectric properties and it may comprise one of a mineral oil or a vegetable oil. The cooling fluid may also comprise an FR3 vegetable oil or Midel synthetic ester oil.

In one aspect, the invention features a three phase static synchronous compensator configured to be installed in and provide reactive power to a three phase medium voltage electric distribution system. There are three static synchronous compensator units, each connected to a different phase of the three phase medium voltage electric distribution system. Each static synchronous compensator unit includes an enclosure having an interior region and an external surface. There is a multi-level cascaded H-bridge (CHB) converter, contained in the interior region of the enclosure, having a nominal operating voltage at a medium voltage level, where a medium voltage level is in the range of approximately 1 kV to approximately 35 kV AC, and having an input and an output. There is a first electrical bushing on the external surface of the enclosure having a first end configured to be connected to a first phase of the medium voltage electric distribution system and a second end connected to the input of the multi-level CHB converter. There is a second electrical bushing on the external surface of the enclosure having a first end configured to be connected to one of ground, floating ground, or a second phase, and a second end connected to the output of the multi-level CHB converter. There is a cooling system configured to circulate a cooling fluid in the interior of the enclosure to cool the multi-level CHB converter. There is also a controller configured to control each of the three static synchronous compensator units to output reactive power to the three phase medium voltage electric distribution system at a medium voltage level.

In further aspects of the invention one or more of the following features may be included. Each static synchronous compensator unit may include a mounting member on an external surface of the enclosure which may be configured to mate with a bracket affixed to at least one utility pole to mount the three static synchronous compensator units on the at least one utility pole. The cooling system for each static synchronous compensator unit may be configured to passively circulate the cooling in the interior of the enclosure by way of natural convention cooling. The cooling system for each static synchronous compensator unit may include a heat exchanger, in fluid communication with the interior region of the enclosure, and the cooling system may be configured to circulate the cooling fluid between the heat exchanger and the interior of the enclosure by way of natural convention cooling to cool the multi-level CHB converter. The enclosure for each static synchronous compensator unit may include a plurality of vertical cooling channels formed on an interior wall of the enclosure and the cooling system for each static synchronous compensator unit may be configured to circulate the cooling fluid in the interior of the enclosure and through the plurality of cooling channels by way of natural convection cooling to cool the multi-level CHB converter. Each multi-level CHB converter may comprise a plurality of discrete components positioned in a vertical direction in the interior region of the enclosure such that they have a heat density weighted average center at a first height along the vertical direction in the interior region of the enclosure; wherein the heat exchanger having a vertical cooling average center at a second height along vertical direction in the interior region of the enclosure; and wherein the first height of the heat density weighted average center is below the second height of the vertical cooling average center of the heat exchanger in order to sustain flow of the cooling fluid between the enclosure and the heat exchanger through natural convention. Each multi-level CHB converter may comprise a plurality of capacitors, a plurality of inductors, and a plurality of semiconductor switches, and the plurality of capacitors may be positioned at a height along the vertical direction which is greater than the height along the vertical direction of the plurality of inductors, and the plurality of semiconductor switches. The cooling fluid in each cooling system may include dielectric properties. The cooling fluid may comprise one of a mineral oil or a vegetable oil. The cooling fluid may comprise an FR3 vegetable oil or Midel synthetic ester oil. The three static synchronous compensator units may be connected to the three phase medium voltage electric distribution system in a grounded WYE configuration. The three static synchronous compensator units may be connected to the three phase medium voltage electric distribution system in a floating WYE configuration. The three static synchronous compensator units may be connected to the three phase medium voltage electric distribution system in a DELTA configuration.

These and other features of the invention will be apparent from the following detailed description and the accompanying figures, in which:

BRIEF DESCRIPTION OF DRAWINGS

FIG. 9A is a perspective view of the rear side of the STATCOM of FIG. 1;

FIG. 9B is a perspective view of the front side of the STATCOM of FIG. 1;

DETAILED DESCRIPTION

Figure 1:
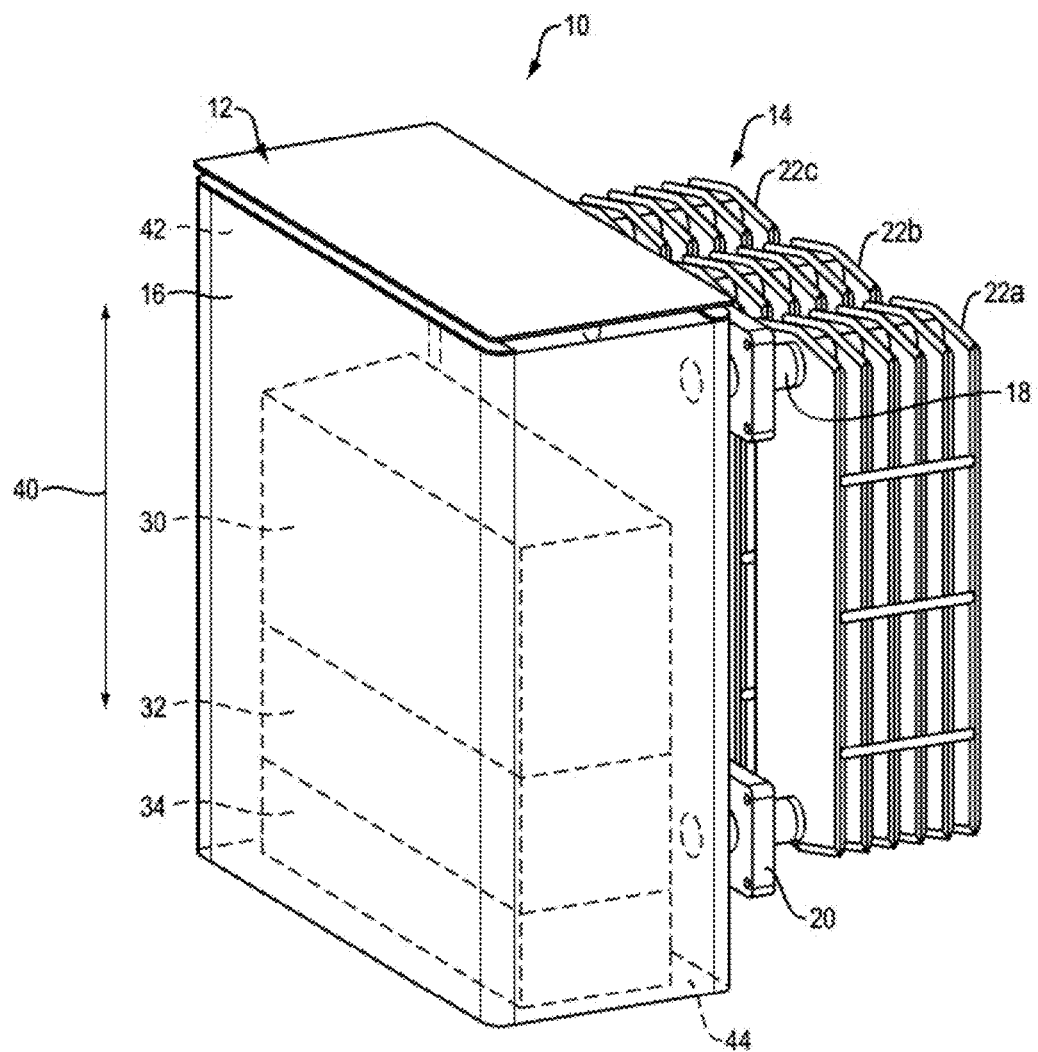
FIG. 1 is a side perspective view of a STATCOM system according to an aspect of this invention.

The disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein.

Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure. Moreover, it is noted that like reference numerals represent similar parts throughout the several views of the drawings.

To assist understanding of the invention, a preferred embodiment will be described in detail below. The detailed description of the preferred embodiment of the invention will be directed to a medium voltage STATCOM, which may be connected directly to a distribution line in a utility power network (i.e. without using a transformer) and which may be compact enough to be mounted on a utility pole within a power distribution system. First, certain general information about a preferred embodiment of the medium voltage STATCOM system according to this invention will be described. Then, additional details of different aspects of the STATCOM system, such as the cooling system, electrical/electronic components, and interconnection to the distribution system will be described in turn below.

STATCOMs are power electronic converters used for controlling reactive current flow to/from an electric power system. The STATCOM described herein is designed to be directly connected to the distribution grid on a utility power system, which is operating at a medium voltage level. According to ANSI/IEEE 1585 (and as used herein), medium voltage levels range from 1 kV to 35 kV AC. A certain prior art STATCOM is made from a three-phase voltage source inverter with all three legs (also referred to herein as poles or phases) of the inverter connected to the same DC bus. The maximum value of the DC bus voltage is limited by the voltage rating of the devices comprising the voltage source inverter. This maximum DC bus voltage then imposes a limit on the AC voltage that can appear between phase legs. Unfortunately, this AC voltage is often too low to directly connect to an electric power system operating at a medium voltage level or greater, so the use of a step-up transformer is often required to enable operation at higher voltages.

The STATCOM according to an aspect of this invention is a different type than that using a three-phase source inverter described in the previous paragraph. Instead, it uses a multi-level converter called a cascaded H-Bridge (CHB) converter, which enables operation at higher voltages and often eliminates the need for a step-up transformer when connecting to medium voltage distribution systems, for example. In contrast to the three-phase converter STATCOM described above, CHB STATCOMs are natively single phase and use CHB converters which are not connected to the same DC bus. When identical voltages are used for each capacitor of the CHB converter, the total converter voltage of a given pole can take any integer multiple of $V_{dc}$ between $-N_{cells} \times V_{dc}$ and $+N_{cells} \times V_{dc}$, where $N_{cells}$ is the number of CHB cells. The total CHB converter voltage is used to control the pole current, which flows through all individual H-Bridge cells in a given leg or phase, since the CHB cells are connected in series.

As will be described in more detail below, because CHB STATCOMs according to this invention are packaged as single phase devices and do not require a transformer to connect to a medium voltage distribution line, they can be made of a weight and size that is capable of being lifted and installed on a utility pole in a power distribution grid by a standard utility truck using conventional equipment. In order to achieve such a compact size capable of pole mounting very high power density must be achieved and it is on the order of three times the power density of prior art STATCOMs.

If a three phase STATCOM is needed for an application, three single phase units are installed together and connected and configured to operate as a three phase unit. Again, the three phase STATCOM described herein may be installed on one or more utility poles using a standard utility truck and conventional equipment.

In the following sections, additional details about the components, operation and installation of the STATCOM system according to an aspect of this invention will be described.

Cooling System

STATCOMs contain numerous discrete sources of heat (e.g. power semiconductor switches, capacitors, and inductors) non-uniformly distributed within an enclosure. As a result, more complex cooling methods using dielectric fluids pumped by cooling loops and/or cold-plate based solutions have been required in the prior art. For example, U.S. Pat. No. 6,016,007, describes a power electronics cooling apparatus which utilizes a dielectric fluid pumped through a cold plate to cool the power electronic semiconductors. This adds to the size and complexity of the overall system. Less complex, passive cooling systems in STATCOM systems have yet to be realized.

With the STATCOM system described herein, the power semiconductors, filter components, and other discrete components may be disposed in a housing and immersed in a dielectric fluid which is passively driven using natural convection through an internal cooling loop in the housing and through an external fluid to air heat exchanger connected to the housing. The cooling system is characterized by locating power semiconductors, key filter elements and other power dissipation components below a critical vertical distance from the base of the housing. This critical distance depends upon the cooling loop geometry and allows for successful passive cooling of the power semiconductors and filter elements.

STATCOM system 10, which may be pole mounted and interconnected to the distribution system of a utility, as described in detail below, is depicted in FIG. 1. System 10 includes an enclosure or housing 12, which is interconnected to a dielectric fluid (a liquid or gas, such as air or oil) to air heat exchanger 14. Heat exchanger 14 is positioned adjacent to housing 12 and is interconnected to the internal space 16 of housing 12 through multiple ports, two of which are visible in this view. They are upper or inlet port 18 and lower or outlet port 20. Dielectric fluid contained in the internal space 16, as well as in the heat exchanger 14, flows through internal space 16 and into heat exchanger 14 through inlet ports (e.g. inlet port 18) and from heat exchanger 14 through outlet ports (e.g. outlet port 20). In this example there are three sets of inlet and outlet ports, one for each bank of radiator fins 22a, 22b, and 22c of heat exchanger 14; however, any suitable type/configuration of heat exchanger may be used. The radiator fins have a substantial surface area to allow for air cooling via conduction of the dielectric fluid as it passes there-through. While three radiator fin banks are used in this embodiment, this is not a limitation of this invention as various numbers and sizes of radiator fin banks may be used.

Within internal space 16 of housing 12 are components which dissipate a significant amount of heat when they are operational and need to be cooled appropriately to avoid failure. The components in this example include a plurality of capacitors 30, semiconductor switching devices 32, e.g. IGBTs, and inductors 34 which are disposed in the internal space 16 in a stack along the vertical direction 40 of the housing 12. In this configuration the capacitors 30, which do not dissipate significant heat, are located on top of the stack at the highest position in vertical direction 40 closest to the top portion 42 of housing 12. The semiconductor switches 32 are next highest in the stack and inductors 34 are lowest in the stack and located in the bottom portion 44 of the housing 12. The semiconductor switches 32 and the inductors 34 dissipate a significant amount of heat compared to capacitors 30.

Figure 2B:
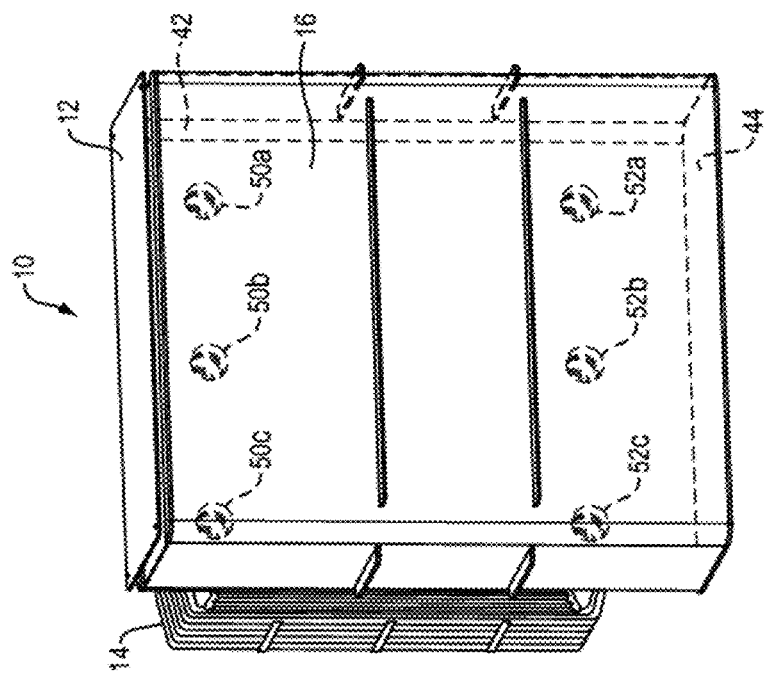
FIG. 2B is a front perspective of the STATCOM system of FIG. 1 with certain the discrete components removed from the enclosure.
Figure 2A:
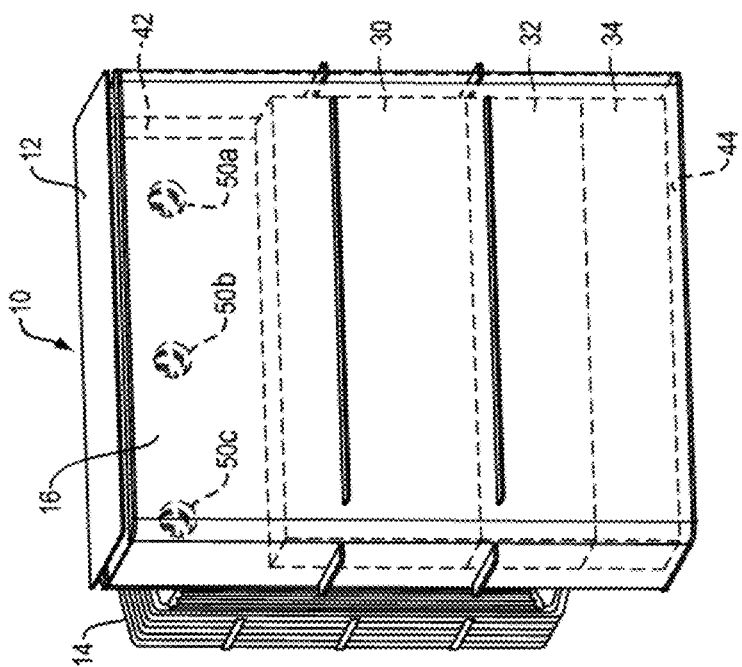
FIG. 2A is a front perspective of the STATCOM system of FIG. 1.

In FIGS. 2A and 2B, the interior of housing 12 is more clearly depicted. Apertures 50a-c in the back wall and the top portion 42 of housing 12 are interconnected to inlet ports, e.g. 18, allowing the cooling fluid to pass into the banks of radiator fins 22a, 22b, and 22c of heat exchanger 14. As visible in FIG. 2B, apertures 52a-c in the back wall and the bottom portion 44 of housing 12 are interconnected to outlet ports, e.g. 20, allowing the cooling fluid to pass from the banks of radiator fins 22a, 22b, and 22c of heat exchanger 14, returning to housing 12.

Referring again to FIGS. 1 and 2A, the main components which dissipate power and generate heat, namely, semiconductor switching devices 32 and inductors 34, can be arranged in any order in the internal space 16 in a stack along the vertical direction 40 of the housing 12, as long as the heat density weighted average center of such components is located below the cooling average center point of the external cooling loop. When this condition is met, passive cooling is driven by internal natural convection in the dielectric fluid and natural convection of the air surrounding the heat exchanger.

The "heat density weighted average center" is a unique point representing an aggregation of the discrete multiple heating components which can be used to determine an appropriate height within the enclosure relative to a cooling average center of the heat exchanger to achieve successful passive cooling. The heat density weighted average center is determined by the following formula:

$$y_{center} = \frac{\int_0^H y\,dq}{Q}$$

Where H is the total height of discrete heating components, q is linear heating density and Q is the total heat generation of the heating components.

Figure 3:
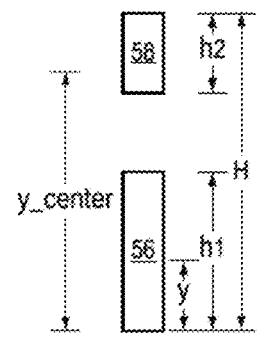
FIG. 3 schematic representation of the discrete components of the STATCOM system of FIG. 1.

As an example of this calculation, in FIG. 3, there are shown a two discrete heating component 56 and 58 (e.g. semiconductor switches and inductors) with different heating rates $q_1$ and $q_2$. Heating component 56 is 8 in. in height (h1) and generates a total 8 W power uniformly along its height while heating component 58 is 4 in. in height (h2) and generates 400 W of power uniformly along its height. The total height, H, from the bottom of enclosure 62 to the top of heat dissipating component 58 and 58 is 16 in. The linear heating density for heating component 56 is calculated to be 1 W/in and for heating component 58 is 100 W/in. The "heat density weighted average center" (y_center) for this particular example may be determined by utilizing the formula above to be 13.8 in. The cooling average center of an air cooled heat exchanger can be similarly determined by the above formula, where q is the linear cooling density along the heat exchanger.

Figure 4:
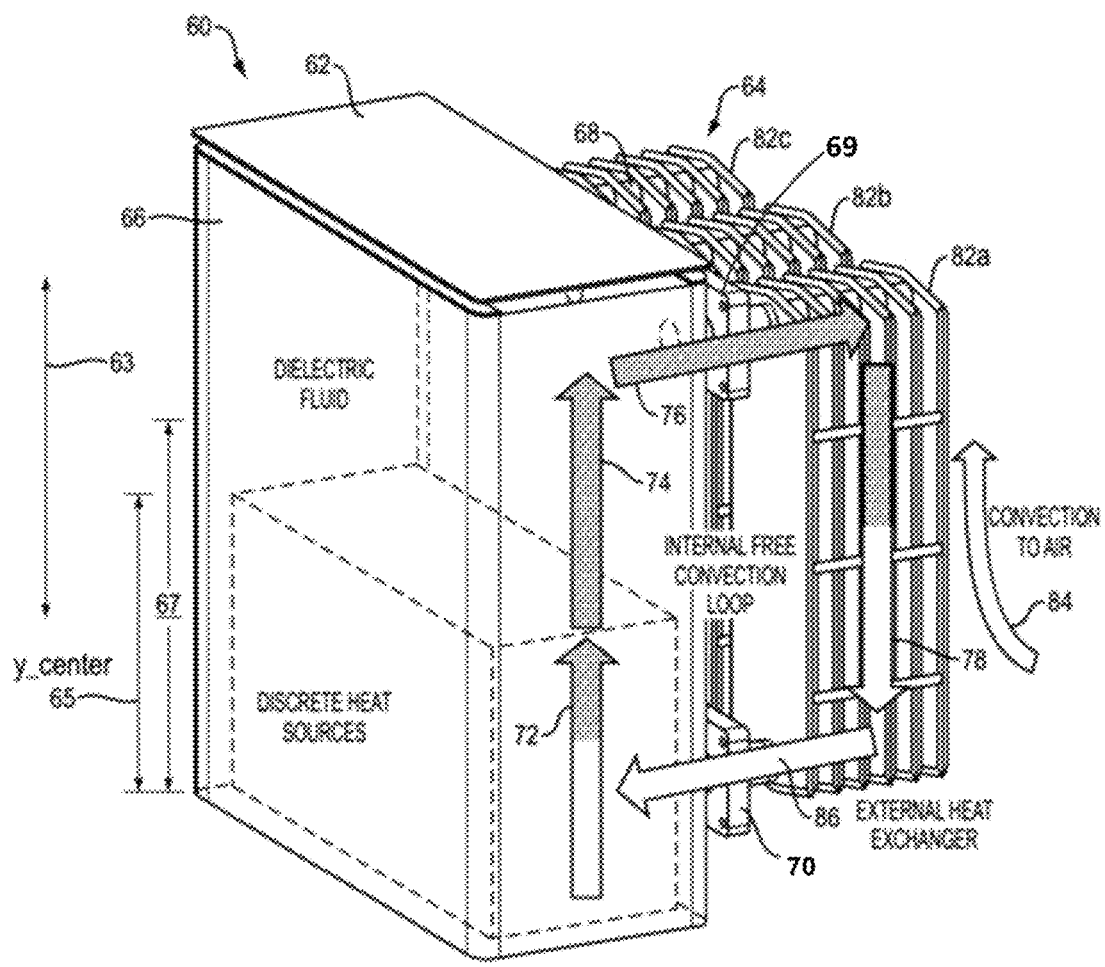
FIG. 4 is a side perspective view of the STATCOM system depicting the flow of dielectric fluid using natural, convention cooling according to an aspect of this invention.

To demonstrate the passive or natural convection cooling according to this invention, power electronics based system 60 is shown in FIG. 4. System 60 includes multiple discrete sources of heat, such as power semiconductors and filter components as shown in FIGS. 1 and 2A. However, in this view the discrete components are not shown within enclosure or housing 62 to more clearly depict the natural convection cooling loop according to this invention. Heat exchanger 64 is positioned adjacent to housing 62 and is interconnected to the internal space 66 of housing 62 through multiple ports, e.g. upper or inlet port 68 and lower or outlet port 70. As shown by arrows 72 and 74 the dielectric fluid contained in the internal space 66 flows upward from outlet port 70, proximate the bottom of housing 62 to the top of housing 62. The dielectric fluid is at its coolest point as it exits the heat exchanger 68 and is increasingly warmed as it passes by the discrete components extracting heat from the discrete components.

Near the top of housing 62, the heated dielectric fluid flows into heat exchanger 68 via the inlet ports, e.g. inlet port 69, in the direction indicated by arrow 76 and flows downward through banks of radiator fins 82a, 82b, and 82c in the direction of arrow 78. As shown by arrow 84, due to the temperature difference between the heated fins and the ambient air temperature, convection causes an upward airflow across the radiator fins cooling the dielectric fluid as it passes there-through. At the bottom of heat exchanger 68 the cooled dielectric fluid flows through outlet ports (e.g. outlet port 70) in the direction of arrow 86 and back into housing 62.

The placement of power dissipating components along the vertical direction (shown by arrow 63) of housing 62 to produce heat density weighted average center at point 65 of such components below the cooling average center of air heat exchanger 68 at point 67 enables bulk free convection driven flow (i.e. no active pumping) of the dielectric fluid, which in this application may be high dielectric strength mineral oil, such as FR3 or Midel synthetic ester oil, or a similar fluid. Failure to locate heat density weighted average center 65 of the power dissipating components below the cooling average center 67 of air heat exchanger 68 will render the free convection cooling loop effectively disabled.

The vertical location of the primary power dissipating components is particularly important in systems which use mineral oil or vegetable oil-based high dielectric strength oils as the cooling fluid. If the aggregate heat input by the heat sources represented by the heat density weighted average center is located above cooling average center of air heat exchanger, the viscosity of these oils will result in only the oil above the primary heat sources becoming hot and having reduced density. As a result, there will be insufficient total column density difference between the hot column of fluid in the housing and the cold column of fluid in the oil-to-air heat exchanger to drive the fluid flow around the internal loop without an active pumping source.

Figure 5A:
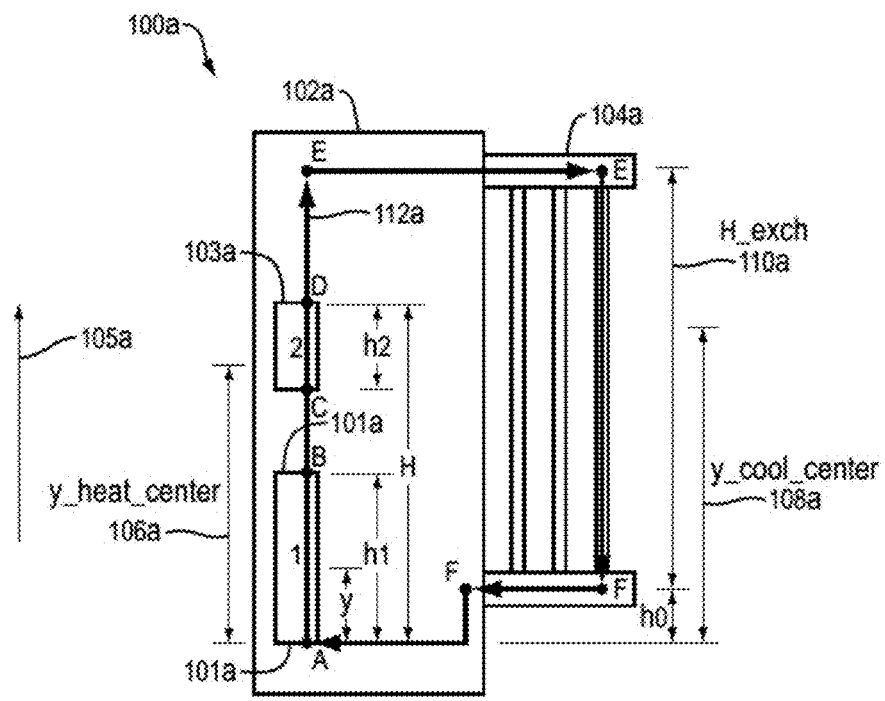
FIG. 5A is a cross-sectional view of the STATCOM system with discrete component placement producing natural, convection cooling according to an aspect of this invention.

As shown in FIG. 5A, a representative STATCOM system 100a includes enclosure or housing 102a and heat exchanger 104a. The discrete power dissipation components 101a and 103a are arranged vertically in the direction indicated by arrow 105a within the housing 102a to produce a heat density weighted average center 106a which may be calculated as described above. The cooling average center 108a of heat exchanger 104a may also be calculated in the manner described above. Since the height 110a of the heat exchanger 104a is positioned near the top of enclosure 102a and the discrete components 101a and 103a are positioned relatively low in enclosure 102a, it places the cooling average center 108a at a position above the heat density weighted average center 106a of the discrete components in vertical direction 105a. Therefore, there will be sufficient total column density difference between the hot column of fluid in housing 102a and the cold column of fluid in the heat exchanger 104a to drive the fluid flow around the internal loop 112a without an active pumping source.

One way to achieve a relatively low heat density weighted average center 106a is to locate the discrete components having the highest power dissipation, thus heat generating capacity (i.e. power semiconductors and inductors) below the discrete components having the lowest power dissipation thus heat generating capacity (i.e. capacitors), as shown in FIGS. 1 and 2A. This is contrary to the typical arrangement of components in a power electronic system. For example, capacitors are usually located at the bottom of the stack, which is the coolest location in the enclosure as it is where the fluid is returned from the heat exchanger and it is at its coolest temperature. Manufacturer specifications require relatively low maximum heating of capacitors as compared to semiconductor switches and inductors. Capacitors may have maximum heat capability in the range of 85 degrees C. as compare to 105-120 degrees C. for semiconductor switches and inductors. With the current design, the capacitors could be located at the bottom of the stack, but in order to achieve a cooling average center of the heat exchanger at a position above the heat density weighted average center of the discrete components the enclosure height and the height/length of the heat exchanger would need to be increased significantly. Instead, according to an aspect of the invention, the capacitors may be positioned at the top of the stack. This still provides adequate cooling for the capacitors while at the same time it achieves natural convection cooling without having to increase the height of the enclosure.

Figure 5B:
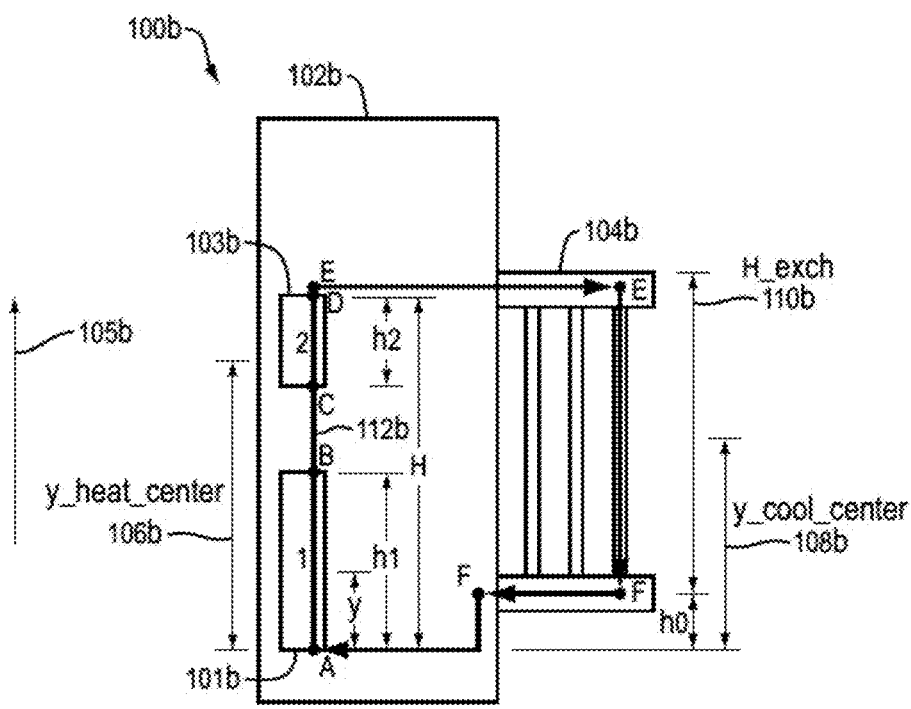
FIG. 5B is a cross-sectional view of the STATCOM system with discrete component placement not producing natural, convection cooling according to this invention.

As shown in FIG. 5B, another representative STATCOM system 100b includes housing 102b and heat exchanger 104b. The discrete power dissipation components 101b and 103b are arranged vertically in the direction indicated by arrow 105b within the housing 102b to produce a heat density weighted average center 106b which may be calculated as described above. The cooling average center 108b of heat exchanger 104b may also be calculated in the manner described above. In this example, in contrast to the example shown in FIG. 5A, the height 110b of the heat exchanger 104b is positioned further from the top of enclosure 102b resulting in the cooling average center 108b being positioned lower than the cooling average center 108a of FIG. 5A. The discrete components 101b and 103b have the same power dissipation characteristics, size and positioning along the vertical direction of the enclosures, but due to the low positioning of the heat exchanger 104b, the cooling average center 108b is at a position above the heat density weighted average center 106a of the discrete components along the vertical direction 105b. Therefore, there will be insufficient total column density difference between the hot column of fluid in housing 102b and the cold column of fluid in the heat exchanger 104b to drive the fluid flow around the internal loop 112b without an active pumping source.

Figure 6A:
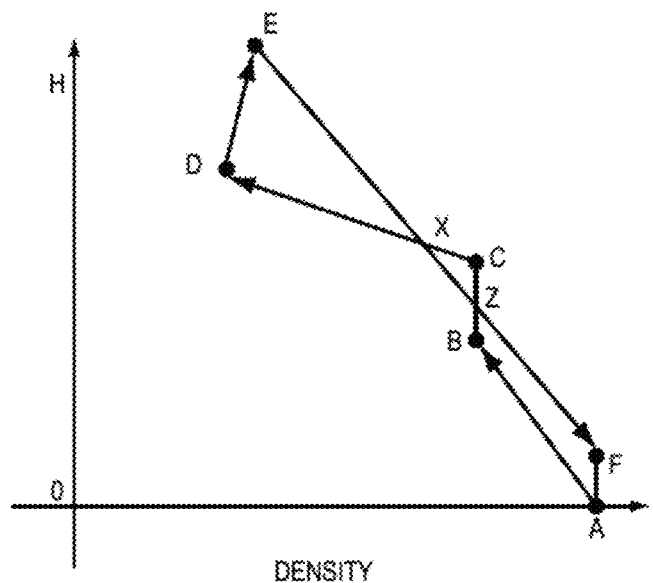
FIG. 6A depicts a plot of coolant density change in the vertical direction of the enclosure of the STATCOM system of FIG. 5A.
Figure 6B:
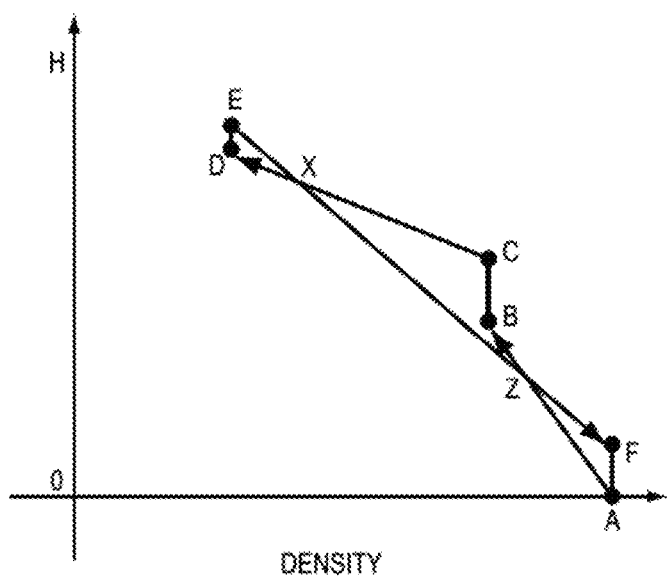
FIG. 6B depicts a plot of coolant density change in the vertical direction of the enclosure of the STATCOM system of FIG. 5B.

The above two examples depicted in FIGS. 5A and 5B are analytically modeled in FIGS. 6A and 6B, respectively, which show the density change along the x-axis plotted against the height of the housings 102a and 102b. The natural convection is driven by the thermal expansion and subsequent change of density of the dielectric fluid by temperature.

In FIG. 6A it is shown that heat is applied between points A and D by the discrete components 101a and 103a. Due to the heat increase between points A and B and between points C and D, the density of the dielectric fluid decreases and thus physically rises in enclosure 102a. From points D to E some heat is removed from the dielectric fluid due to convection on the external surfaces of the application enclosure. This causes the density to increase slightly between points D and E. The majority of the heat is removed as the fluid passes through the heat exchanger 104a in the external cooling loop from points E to F. This causes the density to increase and the fluid to cool. Between points F and A, the cooled fluid returns to the enclosure 102a. The basic relationship between thermal driving force produced by heating component and pressure drop in the loop can be formulated as:

$$\oint \rho \vec{g} \cdot \vec{dl} = \Delta P_{internal} \Delta P_{loop}$$

Where $\Delta P_{internal}$ is the pressure change within the enclosure and $\Delta P_{loop}$ is the pressure change in the heat exchanger and the addition of these pressure changes equals the integration of fluid density multiplied by gravity along the path of the enclosure and the heat exchanger. Since the total pressure drop of the loop is always positive, in order to maintain a passive flow in the external cooling loop, a net positive driving force must be maintained. As described above, this can be achieved by ensuring that the heat density weighted average center is below the cooling average center point of the external cooling loop. This is graphically depicted in FIG. 6A where area DEX plus ABZF is larger than area XCZ (i.e. net enclosed area is positive) thus net positive driving force is produced resulting in natural convection flow of the dielectric fluid around the cooling loop.

In FIG. 6B it is shown how heat is applied between points A and B, between points C and D by the discrete components, which points are also depicted in FIG. 5B. This is graphically depicted in FIG. 6B where area CXZB is larger than area DEX and AZF combined indicating a net negative driving force (i.e. net enclosed area is negative) resulting in no natural convection flow of the dielectric fluid around the cooling loop.

In the above described examples, only one external cooling loop (albeit with multiple inlet/outlet ports) is shown. However, in alternate configurations, there may be several parallel loops (each loop with several inlet/outlet ports and a heat exchanger) positioned at different heights in the vertical direction of the housing, as long as each loop adheres to the model described above where the vertical cooling center of the heat exchangers remain above the heat density weighted average center of the discrete components.

Figure 7A:
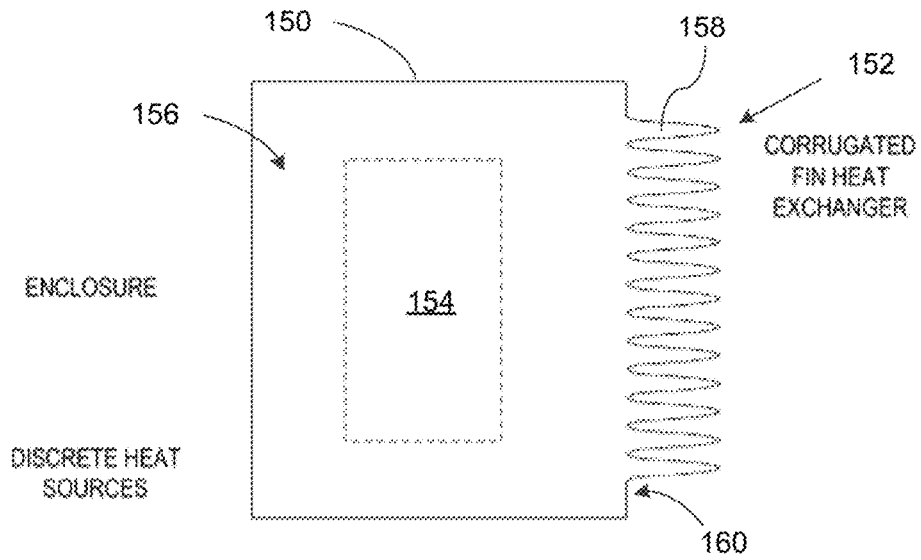
FIG. 7A is a top plan view of an alternative enclosure for the STATCOM system according to an aspect of this invention.
Figure 7B:
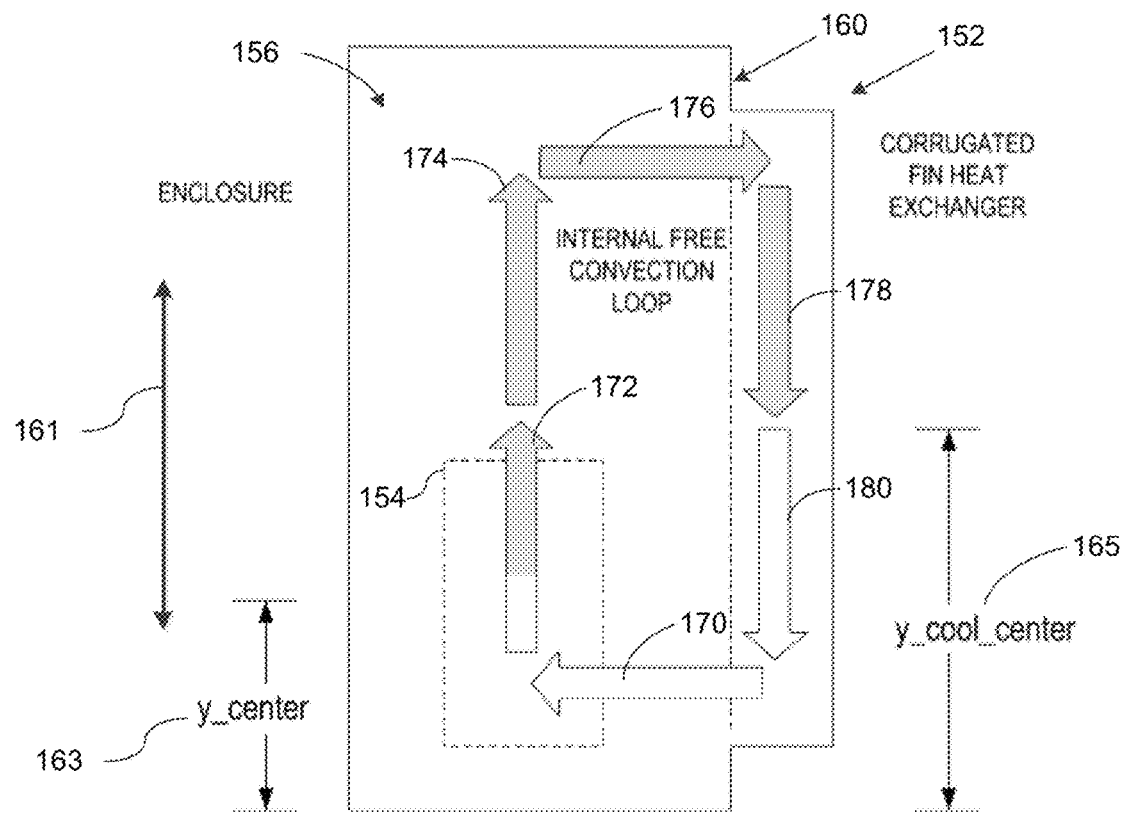
FIG. 7B is a cross-sectional view of the alternative enclosure of FIG. 7A.

In an alternative embodiment, an enclosure 150, FIGS. 7A and 7B, having corrugated fins 152 may be used to establish passive convection cooling within the enclosure, instead of establishing flow in the enclosure using an external heat exchanger, as described above. Shown within enclosure 150 are multiple discrete sources of heat, such as power semiconductors, filter components and capacitors, represented by box 154 within the interior 156 of enclosure 150. As depicted in FIG. 7A the corrugated fins establish a plurality of vertical cooling channels, such as cooling channel 158, which span the rear face 160 of enclosure 150.

The sufficiently low placement of power dissipating components 154 along the vertical direction (shown by arrow 161) of enclosure 150 produces a heat density weighted average center at point 163. The cooling average center 165 of the corrugated fins 152 can be positioned above the heat density weighted average center at point 163, which will enable bulk free convection driven flow (i.e. no active pumping) of the dielectric fluid contained within interior 156 of enclosure 150. As indicated above, with the external heat exchanger embodiment, the dielectric fluid may be high dielectric strength mineral oil, such as FR3 or Midel synthetic ester oil, or a similar fluid.

Referring to FIG. 7B, with passive convection established, cooled dielectric fluid contained in the interior 156 of enclosure 150 flows out from the bottom of the corrugated fins 152, as represented by arrow 170, where it encounters the discrete sources of heat 154 and causing the dielectric fluid to warm and flow upward, as represented by arrows 172 and 174 toward the top of the enclosure 150. The heated dielectric fluid flows into corrugated fins 152, in the direction indicated by arrow 176 and flows downward through cooling channels (e.g. cooling channel 158) in the direction of arrows 178 and 180. At the bottom of the cooling channels, the cooled dielectric fluid flows out toward the power dissipating components 154.

Electrical/Electronic Components

A schematic diagram of the electrical components of STATCOM 10 within housing 12 are shown in FIG. 7. The components include a plurality of capacitors 30, semiconductor switching devices 32, e.g. IGBTs/diodes, and inductors 34 which are disposed in the internal space 16 of the housing 12, as described above. The components are connected to the distribution grid by bushings 200 and 202 mounted on an external surface of housing 12. Bushing 200, which may be connected to one phase of a medium voltage distribution line (not shown), is also connected serially to a first end of inductor 204. The second end of inductor 204 is connected to a first power electronic cell 205a. Power electronic cell 205a may include a semiconductor component 206a, which is depicted generally as a semiconductor switch 208a across which is connected diode 210a. Connected in parallel across power semiconductor component 206a is capacitor 212a.

While a number of configurations of first power electronic cell 205a are possible, one specific configuration is depicted in FIG. 7B, as one cell of a cascaded H-bridge (CHB) converter. As shown, capacitor 212a, is connected in parallel across semiconductor component 206a, which has a plurality of switches. In this example, the switches comprise four IGBT transistor/diode pairs 220a, 222a, 224a, and 226a connected in an H bridge configuration. IGBT transistor/diode pairs 220a and 224a are connected in series across capacitor voltage Vdc with IGBT transistor/diode pair 220a being connected at its first end to +Vdc and IGBT transistor/diode pair 224a being connected at its first end to −Vdc. The second ends of IGBT transistor/diode pairs 220a and 224a being connected to each other and to the positive terminal of H-Bridge cell 205a, +V. IGBT transistor/diode pairs 222a and 226a are connected in series across capacitor voltage Vdc with IGBT transistor/diode pair 222a being connected at its first end to +Vdc and IGBT transistor/diode pair 226a being connected at its first end to −Vdc. The second ends of IGBT transistor/diode pairs 222a and 226a being connected to each other and to the negative terminal of H-Bridge cell 205a, −V.

Connected in series with first power electronic cell 205a is second power electronic cell 205b, which is configured in a like manner to power electronic cell 205a and includes power semiconductor component 206b. Power semiconductor component 206b comprises generally power semiconductor switch 208b across which is connected diode 210b. Connected in parallel across power semiconductor component 206b is capacitor 212b.

A number, n, of power electronic cells may be connected in series to form the desired H-bridge topology for the power/voltage level required for a particular application. The last power electronic cell 205n is connected to a first end of inductor 214 and its second end is connected to bushing 202, which in turn may be connected to ground. All power electronic cells 205b-205n may be configured in the same manner as first power electronic cell 205a, FIG. 7B, as a cell of a cascaded H-bridge (CHB) converter.

While the STATCOM according to this invention is capable of being applied to the full range of medium voltage systems (i.e. 1 kV to 35 kV AC), one example application may be directed to a STATCOM capable of operating on up to 13.8 kV AC phase to phase (7.8 kV phase to ground) distribution systems. In this example, the electrical components would be sized appropriately to handle these voltage levels. Each power electronic cell 205a-205n may be sized to handle a portion of the total required operating voltage plus some level of margin by using commercially available components such as IGBT's and diodes ranging from 1.2 to 6.5 kV.

CHB STATCOMs may be switched or modulated according to various switching/modulation schemes to produce a desired output waveform. Typical modulation schemes include staircase modulation, phase shifted modulation, and level shifted modulation. Each of these modulation schemes has benefits as well as disadvantages in relation to four key performance criteria. These criteria are: 1) minimizing the number of switching events to reduce power loss, (2) balancing the isolated capacitor voltages of the CHB cells to keep each cell voltage within safe operating levels, (3) producing a high fidelity AC voltage waveform to minimize the passive filter components on the AC side of the converter, and (4) allowing for even distribution of losses among the CHB cells to prevent accelerated wear out of an individual cell. Any of these modulation schemes may be used with the STATCOM according to this invention but the preferred switching scheme is described in co-pending application Ser. No. 15/093,842, filed on Apr. 8, 2016, which is commonly owned by the assignee of this application and is incorporated herein by reference in its entirety.

Installation in the Distribution System

The single phase/pole topology of a multi-level CHB STATCOM, according to an aspect of this invention, as shown in FIG. 7, enables operation at medium voltage and eliminates the need for a step-up transformer. Further, with the very efficient cooling system described above, it allows for such a multi-level CHB converter topology to be packaged in a compact enclosure having dimensions and weight that allow it to be pole-mounted along a feeder circuit within a utility distribution system at specific locations which need VAR support. With the 13.8 kV example described above, the approximate dimensions per single phase unit are 46×32×60 inches (L×W×H) with a weight of approximately 2500 lbs. At this size and weight, these STATCOMs can be readily pole-mounted using standard utility trucks and conventional equipment. At these dimensions and power rating, the STATCOM according to an aspect of this invention can be three or more times as power dense as the prior art STATCOMS.

Figure 8A:
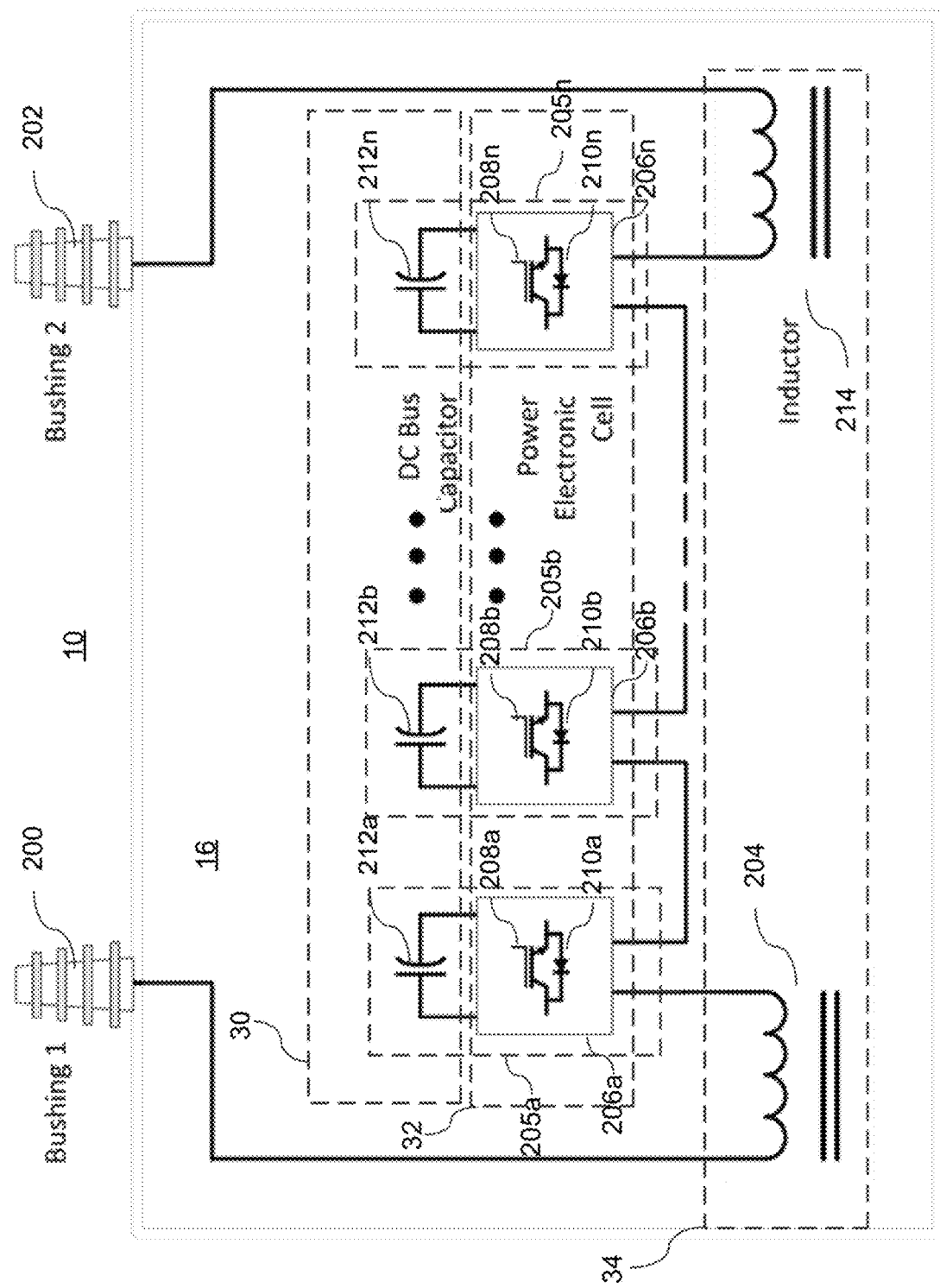
FIG. 8A is a schematic diagram of an exemplary configuration of the internal electrical and electronic components within the STATCOM of FIG. 1.
Figure 8B:
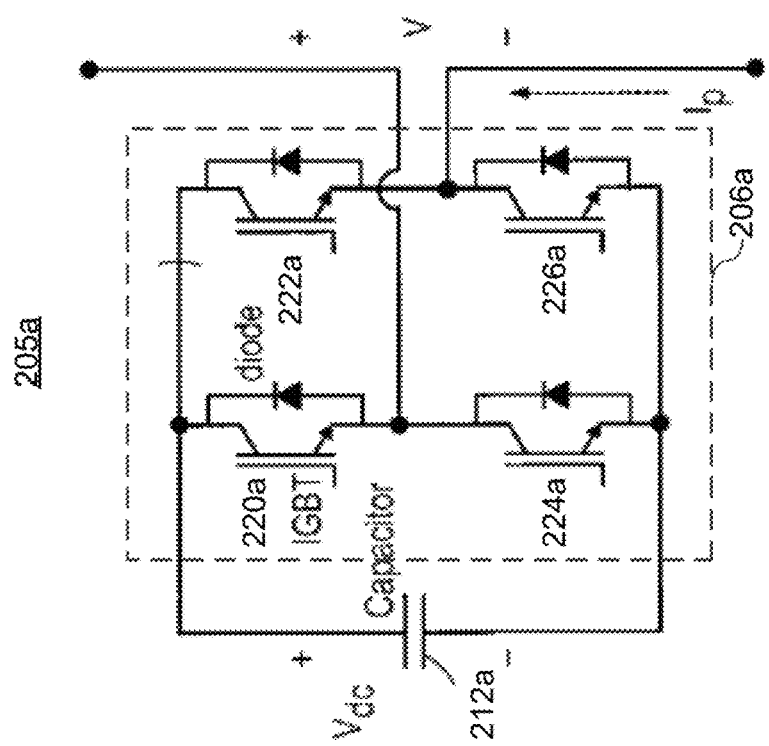
FIG. 8B is a schematic diagram of an exemplary a power electronics cell for the configuration of the internal electrical and electronic components of FIG. 8A.
Figure 10:
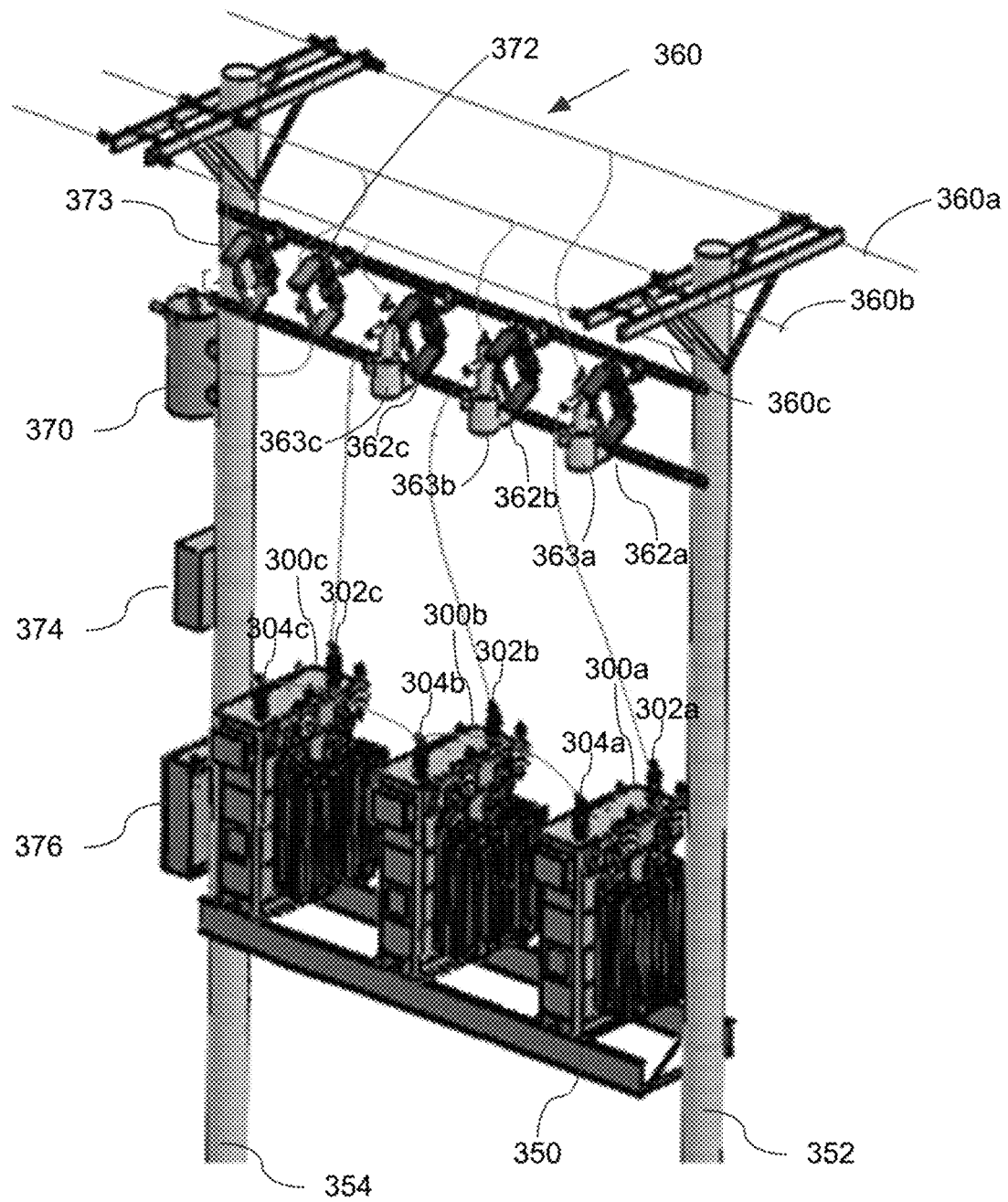
FIG. 10 is a perspective view of a three-phase configuration of the STATCOM according to an aspect of this invention mounted on an H-bracket between two utility poles.

Certain additional external features of the STATCOM according to this invention are depicted in FIGS. 8A and 8B. STATCOM 300 is shown to include bushings 302 and 304, mounted on lid 303. The bushings electrically connect the STATCOM to the medium voltage distribution grid, as shown in FIG. 9 (in a three phase configuration), and as shown in FIG. 10 (in a single phase configuration). Radiator fins 306 are used for convection cooling, as described above in detail. In this embodiment, there are two banks of radiator fins, while the embodiment described above with regard to FIGS. 1, 2, and 4 includes three banks of radiator fins. The number and size of radiator fin banks may be varied and will be application specific.

There is a pressure relief valve 308 to prevent overpressure within the enclosure. Valve 310 allows for sampling internal oil. Grounding lugs are connected to the ground lead for local grounding adjacent to the utility pole on which the STATCOM is mounted. Additionally, there is an interface box 314 which is used to communicate with a system controller unit, 376 in FIG. 9 for three phase configurations and 418 in FIG. 10. for single phase configurations, respectively. Lifting eye bolts 315 and 316 on opposite sides and corners of the STATCOM allow the device to be lifted by a utility truck and pole mounted. And, mounting holes 317 and 318 allow for fasteners to secure the device in place once on a bracket affixed to the pole, as shown, for example in FIG. 9.

FIG. 9 depicts three single phase STATCOM units 300a, 300b, and 300c, configured as a three phase STATCOM system, mounted on an H-bracket 350, which is connected between two utility power poles 352 and 354. Primary, three phase distribution lines 360, comprising phase lines 360a, 360b, and 360c, may be operating at 13.8 kV AC (phase to phase) as part of a feeder system which originates at a distribution system substation (not shown). As noted above, prior art STATCOMs are too large to be pole mounted and are typically installed at the distribution substation. Therefore, they cannot be located proximate a point in the distribution system for VAR support.

Each phase 360a, 360b, 360c, is connected, respectively, to a cutout fuse 362a, 362b, 362c, which will open or "blow" when an excessive phase current flows in order to protect STATCOM units 300a, 300b, 300c. Connected in series to each of the cutout fuses are disconnect switches 363a, 363b, 363c, which are connected respectively to bushings 302a, 302b, 302c of STATCOM units 300a, 300b, 300c. Bushings 304a, 304b, and 304c are tied together to form a WYE point, and may connected to ground (grounded WYE configuration) or not for (floating WYE configuration) depending on the distribution system circuit. Disconnect switches 363a, 363b, 363c may be opened to de-energize the STATCOM in case service is needed.

In order to provide local secondary power, at e.g. 220 v AC, transformer 370, is mounted on utility pole 354 and is connected across primary phases 360b and 360c via cutout fuses 372 and 374, respectively. The secondary output of transformer 370 is connected to uninterruptable power supply 374 and system controller unit 376, both of which are also mounted on utility pole 354. Uninterruptable power supply 374 may be used to provide a limited duration of power to controller unit 376 in the event of power loss on the primary, three phase distribution lines 360. Controller unit 376 is used to interface with and control each STATCOM unit via an interface box (such as interface box 314, FIG. 8A), and may be used to communicate via a SCADA system of the utility.

In certain circumstances VAR support may be required for only one primary phase of a three phase distribution line or where there is only a single phase primary line. This situation is depicted in FIG. 10 where one single phase STATCOM unit 400 is installed on utility pole 402 with bracket 404. Primary phase 406 is connected in series to cutout fuse 408 disconnect switch 410 to bushing 412 of STATCOM unit 400. Bushing 414 is connected to ground.

In order to provide local secondary power, at e.g. 220 v AC, transformer 416, which is also mounted on utility pole 402 is connected to primary phase 406 via cutout fuse 408. The secondary output of transformer 416 is connected to controller unit 418. Communications from system controller unit 418 are transmitted to interface box 420 of STATCOM unit 400 via hard wiring contained in conduit 419.

Figure 11:
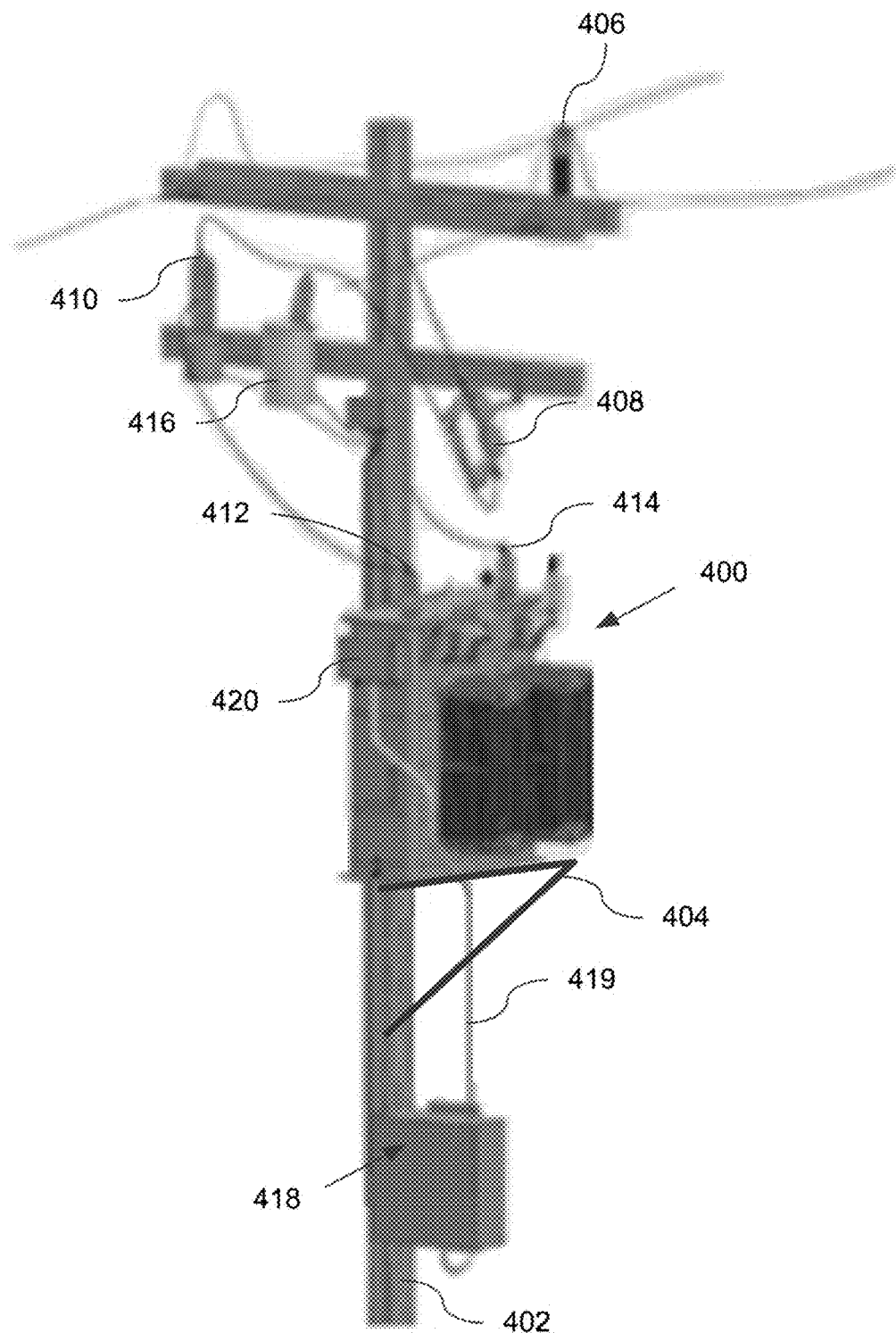
FIG. 11 is a perspective view of a single-phase configuration of the STATCOM according to an aspect of this invention mounted on a bracket on a utility pole.

An example application of the STATCOM according to an aspect of this invention is depicted in FIG. 11 where a portion of a distribution system 500 is depicted. Substation 502 includes a distribution feeder circuit 504 having a three phase primary line 506 powering, for example, feeder branches 508, 510, and 512. On Feeder branches 510 and 512, there are DG power sources 514 and 516, respectively, which, in this example, are photovoltaic (PV) DG sources. PV DG sources 514 and 516 provide supplementary input power to distribution feeder circuit 504. It should be noted that the distributed generation power sources 514 and 516 may be other forms of distributed generation sources such as wind or battery systems. A SCADA system 530, which communicates over network 532, may be included to interact with and control STATCOM 520, VR 518, and other equipment on the feeder circuit 504 or in the sub station 502.

While the distributed generation power sources 514 and 516 are very beneficial in that they provide the supplemental power required on distribution system 500 without the environmental impact of traditional power sources. However, they can create electrical problems such as voltage flicker and voltage violations (i.e. creating voltage levels below accepted minimum requirements, such as 0.95 pu). For example, in case of PV DG systems, when the solar conditions vary, i.e. during partly cloudy days, such issues may arise.

Figure 12:
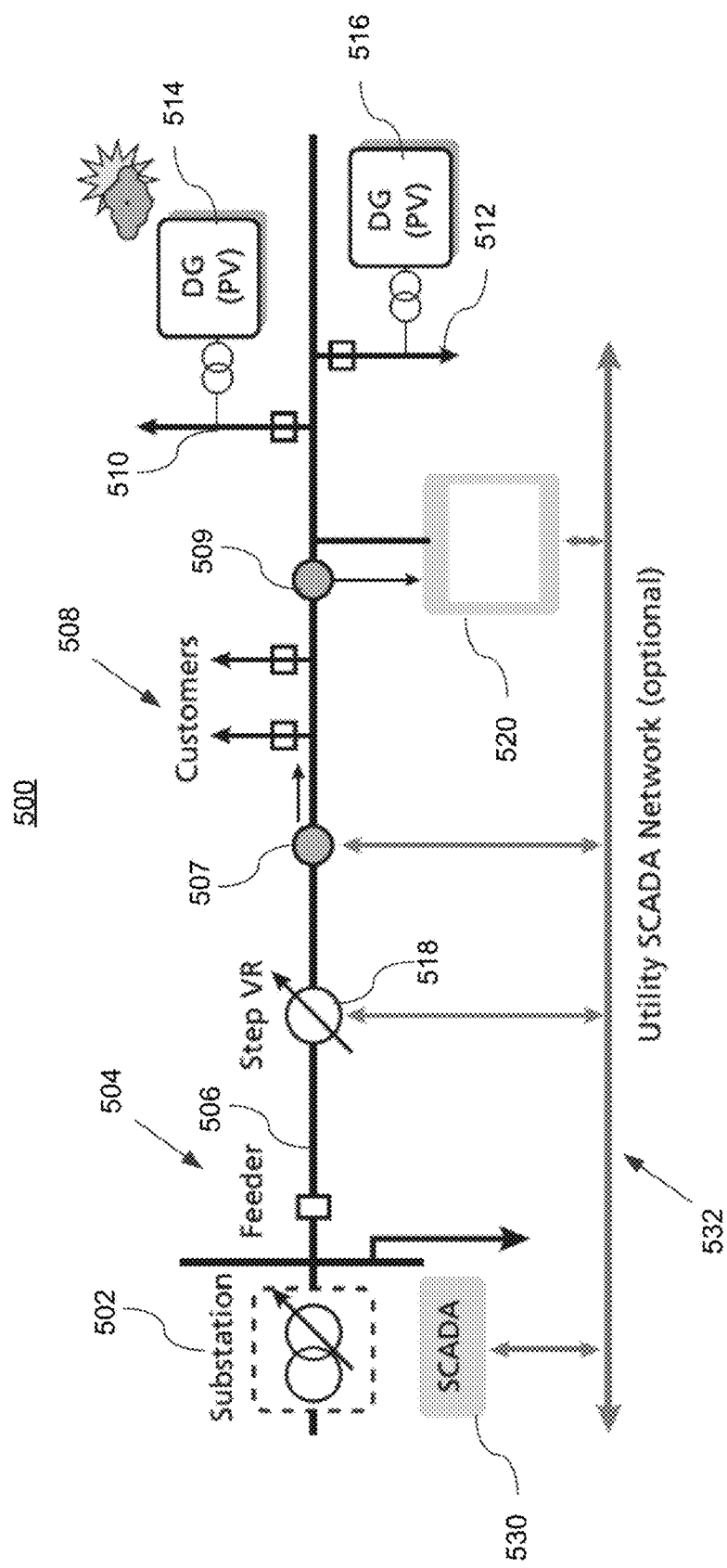
FIG. 12 is a schematic diagram of a three-phase medium voltage distribution feeder system incorporating a STATCOM according to an aspect of this invention.
Figure 13:
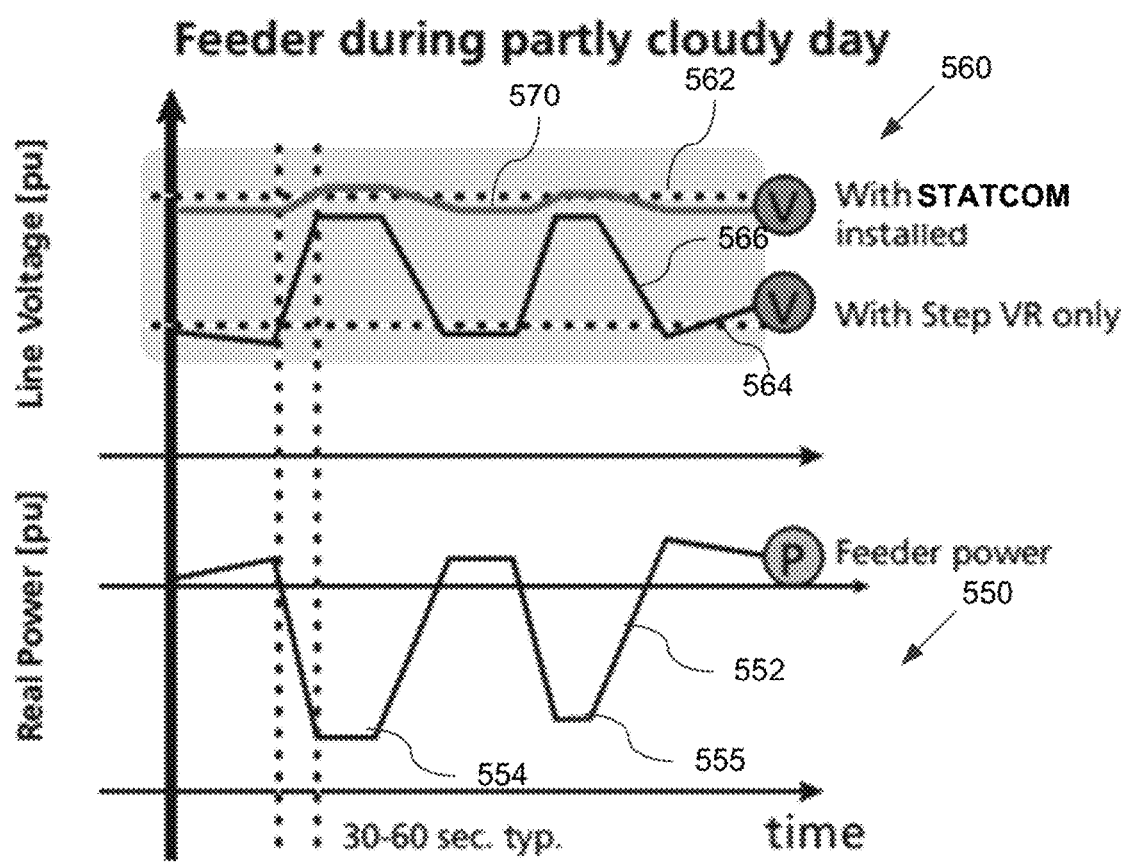
FIG. 13 depicts two graphs showing the impact to power and voltage on the three-phase medium voltage distribution feeder system of FIG. 12 due to distributed generation sources and the benefit of incorporating a STATCOM according to an aspect of this invention into the feeder system.

As shown in graph 550 of FIG. 12, the real power on three phase primary line 506 at point 507 (FIG. 10) is depicted as plot 552. Plot 552 shows that the real power is varying significantly over time and may drop to low points 554 and 555, for example, which may be as low as 0.0 pu. These low power points may be caused by reduction in power by distributed generation power sources 514 and 516, due to cloud cover in the case of DG PV sources. The impact on voltage is depicted in graph 560, which shows that the desired voltage level 562 (dotted line) may be reduced to voltage level 564 (dotted line). This voltage drop may be to a level of 0.95 pu which is significantly below the minimum allowed level of 0.97 pu. Waveform 566 shows that some improvement in voltage recovery at point 509 on three phase primary line 506 can be realized by utilizing a voltage regulator (VR), such as VR 518 of FIG. 10. However, the improvement in voltage is quite choppy and does not provide very uniform voltage recovery.

In contrast to the voltage recovery achieved with the input of VR 518, the addition of STATCOM 520, according to an aspect of this invention, provides quite a dramatic improvement. Waveform 570 shows that at point 507 on three phase primary line 506, the voltage level is maintained substantially at the desired voltage level indicated by dotted line 562.

While the foregoing description of the invention enables one of ordinary skill to make and use what is considered presently to be the best mode thereof, those of ordinary skill will understand and appreciate the existence of variations, combinations, and equivalents of the specific embodiments and examples herein. The above-described embodiments of the present invention are intended to be examples only. Alterations, modifications and variations may be effected to the particular embodiments by those of skill in the art without departing from the scope of the invention, which is defined solely by the claims appended hereto. The invention is therefore not limited by the above described embodiments and examples.

Having described the invention, and a preferred embodiment thereof, what is claimed as new, and secured by letters patent is:

We claim:

1. A static synchronous compensator configured to be installed in and provide reactive power to a medium voltage electric distribution system, comprising:
   An enclosure having an interior region and an external surface;
   A multi-level cascaded H-bridge (CHB) converter, contained in the interior region of the enclosure, having a nominal operating voltage at a medium voltage level, where a medium voltage level is in the range of approximately 1 kV to approximately 35 kV AC, and having an input and an output;
   A first electrical bushing on the external surface of the enclosure having a first end configured to be connected to a first phase of the medium voltage electric distribution system and a second end connected to the input of the multi-level CHB converter;
   A second electrical bushing on the external surface of the enclosure having a first end configured to be connected to one of ground, floating ground, or a second phase, and a second end connected to the output of the multi-level CHB converter;
   A cooling system configured to circulate a cooling fluid in the interior of the enclosure to cool the multi-level CHB converter;
   A controller configured to control the multi-level CHB converter to output reactive power to the medium voltage electric distribution system at the medium voltage level; and
   A mounting member on the external surface of the enclosure configured to mate with a bracket affixed to a utility pole to mount the static synchronous compensator on the utility pole.

2. The static synchronous compensator of claim 1 wherein the cooling system is configured to passively circulate the cooling fluid in the interior of the enclosure by way of natural convection cooling.

3. The static synchronous compensator of claim 2 wherein the cooling system includes a heat exchanger, in fluid communication with the interior region of the enclosure, and wherein the cooling system is configured to circulate the cooling fluid between the heat exchanger and the interior of the enclosure by way of natural convection cooling to cool the multi-level CHB converter.

4. The static synchronous compensator of claim 3 wherein the multi-level CHB converter comprises a plurality of discrete components positioned in a vertical direction in the interior region of the enclosure such that they have a heat density weighted average center at a first height along the vertical direction in the interior region of the enclosure; wherein the heat exchanger having a vertical cooling average center at a second height along vertical direction in the interior region of the enclosure; and wherein the first height of the heat density weighted average center is below the second height of the vertical cooling average center of the heat exchanger in order to sustain flow of the cooling fluid between the enclosure and the heat exchanger through natural convention.

5. The static synchronous compensator of claim 2 wherein the enclosure includes a plurality of vertical cooling channels formed on an interior wall of the enclosure and wherein the cooling system is configured to circulate the cooling fluid in the interior of the enclosure and through the plurality of cooling channels by way of natural convection cooling to cool the multi-level CHB converter.

6. The static synchronous compensator of claim 1 wherein the multi-level CHB converter comprises a plurality of capacitors, a plurality of inductors, and a plurality of semiconductor switches, and wherein the plurality of capacitors are positioned at a height along the vertical direction which is greater than the height along the vertical direction of the plurality of inductors, and the plurality of semiconductor switches.

7. The static synchronous compensator of claim 1 wherein the cooling fluid includes dielectric properties.

8. The static synchronous compensator of claim 7 wherein the cooling fluid comprises one of a mineral oil or a vegetable oil.

9. The static synchronous compensator of claim 7 wherein the cooling fluid comprises an ester oil.

10. A three phase static synchronous compensator configured to be installed in and provide reactive power to a three phase medium voltage electric distribution system, comprising:
    Three static synchronous compensator units, each connected to a different phase of the three phase medium voltage electric distribution system, each static synchronous compensator unit including:
    An enclosure having an interior region and an external surface;
    A multi-level cascaded H-bridge (CHB) converter, contained in the interior region of the enclosure, having a nominal operating voltage at a medium voltage level, where a medium voltage level is in the range of approximately 1 kV to approximately 35 kV AC, and having an input and an output;

A first electrical bushing on the external surface of the enclosure having a first end configured to be connected to a first phase of the medium voltage electric distribution system and a second end connected to the input of the multi-level CHB converter;

A second electrical bushing on the external surface of the enclosure having a first end configured to be connected to one of ground, floating ground, or a second phase, and a second end connected to the output of the multi-level CHB converter; and A cooling system configured to circulate a cooling fluid in the interior of the enclosure to cool the multi-level CHB converter;

A controller configured to control each of the three static synchronous compensator units to output reactive power to the three phase medium voltage electric distribution system at the medium voltage level; and Wherein each static synchronous compensator unit includes a mounting member on an external surface of the enclosure which is configured to mate with a bracket affixed to at least one utility pole to mount the three static synchronous compensator units on the at least one utility pole.

11. The three phase static synchronous compensator of claim 10 wherein the cooling system for each static synchronous compensator unit is configured to passively circulate the cooling in the interior of the enclosure by way of natural convention cooling.

12. The three phase static synchronous compensator of claim 11 wherein the cooling system for each static synchronous compensator unit includes a heat exchanger, in fluid communication with the interior region of the enclosure, and wherein the cooling system is configured to circulate the cooling fluid between the heat exchanger and the interior of the enclosure by way of natural convention cooling to cool the multi-level CHB converter.

13. The three phase static synchronous compensator of claim 12 wherein each multi-level CHB converter comprises a plurality of discrete components positioned in a vertical direction in the interior region of the enclosure such that they have a heat density weighted average center at a first height along the vertical direction in the interior region of the enclosure; wherein the heat exchanger having a vertical cooling average center at a second height along vertical direction in the interior region of the enclosure; and wherein the first height of the heat density weighted average center is below the second height of the vertical cooling average center of the heat exchanger in order to sustain flow of the cooling fluid between the enclosure and the heat exchanger through natural convention.

14. The static synchronous compensator of claim 11 wherein the enclosure for each static synchronous compensator unit includes a plurality of vertical cooling channels formed on an interior wall of the enclosure and wherein the cooling system for each static synchronous compensator unit is configured to circulate the cooling fluid in the interior of the enclosure and through the plurality of cooling channels by way of natural convection cooling to cool the multi-level CHB converter.

15. The three phase static synchronous compensator of claim 10 wherein each multi-level CHB converter comprises a plurality of capacitors, a plurality of inductors, and a plurality of semiconductor switches, and wherein the plurality of capacitors are positioned at a height along a vertical direction which is greater than the height along the vertical direction of the plurality of inductors, and the plurality of semiconductor switches.

16. The three phase static synchronous compensator of claim 10 wherein the cooling fluid in each cooling system includes dielectric properties.

17. The three phase static synchronous compensator of claim 16 wherein the cooling fluid comprises one of a mineral oil or a vegetable oil.

18. The three phase static synchronous compensator of claim 16 wherein the cooling fluid comprises an ester oil.

19. The three phase static synchronous compensator of claim 10 wherein the three static synchronous compensator units are connected to the three phase medium voltage electric distribution system in a grounded WYE configuration.

20. The three phase static synchronous compensator of claim 10 wherein the three static synchronous compensator units are connected to the three phase medium voltage electric distribution system in a floating WYE configuration.

21. The three phase static synchronous compensator of claim 10 wherein the three static synchronous compensator units are connected to the three phase medium voltage electric distribution system in a DELTA configuration.

22. A static synchronous compensator configured to be installed in and provide reactive power to a medium voltage electric distribution system, comprising:
An enclosure having an interior region and an external surface;
A multi-level cascaded H-bridge (CHB) converter, contained in the interior region of the enclosure, having a nominal operating voltage at a medium voltage level, where a medium voltage level is in the range of approximately 1 kV to approximately 35 kV AC, and having an input and an output;
A first electrical bushing on the external surface of the enclosure having a first end configured to be connected to a first phase of the medium voltage electric distribution system and a second end connected to the input of the multi-level CHB converter;
A second electrical bushing on the external surface of the enclosure having a first end configured to be connected to one of ground, floating ground, or a second phase, and a second end connected to the output of the multi-level CHB converter;
A cooling system configured to circulate a cooling fluid in the interior of the enclosure to cool the multi-level CHB converter; and
A controller configured to control the multi-level CHB converter to output reactive power to the medium voltage electric distribution system at the medium voltage level;
Wherein the multi-level CHB converter comprises a plurality of capacitors, a plurality of inductors, and a plurality of semiconductor switches, and wherein the plurality of capacitors are positioned at a height along a vertical direction which is greater than the height along the vertical direction of the plurality of inductors, and the plurality of semiconductor switches.

23. A three phase static synchronous compensator configured to be installed in and provide reactive power to a three phase medium voltage electric distribution system, comprising:
Three static synchronous compensator units, each connected to a different phase of the three phase medium voltage electric distribution system, each static synchronous compensator unit including:

An enclosure having an interior region and an external surface;

A multi-level cascaded H-bridge (CHB) converter, contained in the interior region of the enclosure, having a nominal operating voltage at a medium voltage level, where a medium voltage level is in the range of approximately 1 kV to approximately 35 kV AC, and having an input and an output;

A first electrical bushing on the external surface of the enclosure having a first end configured to be connected to a first phase of the medium voltage electric distribution system and a second end connected to the input of the multi-level CHB converter;

A second electrical bushing on the external surface of the enclosure having a first end configured to be connected to one of ground, floating ground, or a second phase, and a second end connected to the output of the multi-level CHB converter; and A cooling system configured to circulate a cooling fluid in the interior of the enclosure to cool the multi-level CHB converter;

A controller configured to control each of the three static synchronous compensator units to output reactive power to the three phase medium voltage electric distribution system at the medium voltage level;

Wherein each multi-level CHB converter comprises a plurality of capacitors, a plurality of inductors, and a plurality of semiconductor switches, and wherein the plurality of capacitors are positioned at a height along the vertical direction which is greater than the height along the vertical direction of the plurality of inductors, and the plurality of semiconductor switches.

* * * * *